United States Patent [19]

Shackle

[11] Patent Number: 4,516,037

[45] Date of Patent: May 7, 1985

[54] CONTROL CIRCUITRY FOR HIGH VOLTAGE SOLID-STATE SWITCHES

[75] Inventor: Peter W. Shackle, Bridgewater, N.J.

[73] Assignee: AT&T Bell Laboratories, Murray Hill, N.J.

[21] Appl. No.: 158,054

[22] Filed: Jun. 9, 1980

Related U.S. Application Data

[63] Continuation-in-part of Ser. No. 972,024, Dec. 20, 1978, abandoned.

[51] Int. Cl.$^3$ .............................................. H03K 17/60
[52] U.S. Cl. ................................ 307/252 A; 307/305; 307/315; 357/22; 357/38
[58] Field of Search .......... 307/311, 315, 305, 252 A; 357/22, 38

[56] References Cited

U.S. PATENT DOCUMENTS

| | | | |
|---|---|---|---|
| 3,116,183 | 12/1963 | Pell | 357/38 |
| 3,271,700 | 9/1966 | Gutzwiller | 307/252 C |
| 3,289,077 | 11/1966 | Miller | 307/271 |
| 3,439,616 | 4/1969 | Goosey et al. | 307/252 A |
| 3,596,114 | 7/1971 | Maupin et al. | 307/315 |
| 3,870,904 | 3/1975 | Schock | 307/252 C |
| 4,117,351 | 9/1978 | Kalfus et al. | 307/252 C |
| 4,217,504 | 8/1980 | Fullmann et al. | 307/252 C |
| 4,250,409 | 2/1981 | Davis et al. | 307/252 A |
| 4,345,163 | 8/1982 | Davis et al. | 307/252 A |

Primary Examiner—Joseph E. Clawson, Jr.
Attorney, Agent, or Firm—Irwin Ostroff

[57] ABSTRACT

A gated diode switch (GDS1, GDS3, GDS4, GDS10) requires a voltage applied to the gate which is more positive than that of the anode and cathode in order to break current flow between the anode and cathode. In addition, a current of at least the same order of magnitude as flows between anode and cathode must flow into the gate of the switch to break current flow. The use of a second gated diode switch (GDS2, GDS20) coupled by the cathode (28, 280) to the gate of a gated diode switch (GDS1, GDS3, GDS4, GDS10) which is to be controlled provides a high voltage and current capability means for cutting off (interrupting) or inhibiting current flow through the gated diode switch (GDS1, GDS3, GDS4, GDS10). The state of a gated diode switch (GDS1, GDS3, GDS4, GDS10) is thus controlled by a second gated diode switch (GDS2, GDS20). The state of the second gated diode switch (GDS2, GDS20) is controlled by a circuitry (A, A0) consisting of an n-p-n transistor (Q1, Q10), at least one p-n-p transistor (Q2, Q20), and at least one diode (D2, D20, D3, D4).

3 Claims, 5 Drawing Figures

CONTROL CIRCUITRY FOR HIGH VOLTAGE SOLID-STATE SWITCHES

CROSS-REFERENCE TO RELATED APPLICATION

This application is a continuation-in-part of my copending application, Ser. No. 972,024, filed Dec. 20, 1978, abandoned.

TECHNICAL FIELD

This invention relates to control circuitry for controlling the state of solid-state switches and, in particular, to control circuitry for controlling the state of solid-state switches which have high voltage and relatively high current capabilities.

BACKGROUND OF THE INVENTION

High voltage and relatively high current capability solid-state switches, such as those described in the articles entitled "A Field Terminated Diode" by Douglas E. Houston et al, published in *IEEE Transactions on Electron Devices*, Vol. ED-23, No. 8, August, 1976, pages 905–911, and "A 500 V Monolithic Bidirectional 2×2 Crosspoint Array" by P. W. Shackle et al, published in 1980 *IEEE International Solid-State Circuits Conference Digest of Technical Papers*, Vol. 23, February, 1980, pages 170–171, and those discussed in U.S. patent application Ser. Nos. 972,056 (A. R. Hartman-T. J. Riley-P. W. Shackle), 972,021 (A. R. Hartman-A. U. Mac Rae-P. W. Shackle), 972,022 (J. E. Berthold-A. R. Hartman-T. J. Riley-P. W. Shackle), and 971,886 (A. R. Hartman-B. T. Murphy-T. J. Riley-P. W. Shackle), all filed Dec. 20, 1978, and having a common assignee with the present application; and U.S. patent application Ser. Nos. 107,774 (A. R. Hartman-T. J. Riley-P. W. Shackle), 107,773 (A. R. Hartman-B. T. Murphy-T. J. Riley-P. W. Shackle), 107,772 (A. R. Hartman-A. U. Mac Rae-P. E. Shackle), 107,780 (J. E. Berthold-A. R. Hartman-T. J. Riley-P. W. Shackle), and 107,775 (A. R. Hartman-T. J. Riley-P. W. Shackle), which were filed Dec. 28, 1979, and which have a common assignee with the present application, have an ON (conducting) state and an OFF (blocking) state. These switches are capable of blocking relatively large potential differences in the OFF state. Each of these switches has two output terminals which are generally denoted as the anode and cathode, a control terminal which is generally denoted as the gate, and a semiconductor body whose bulk separates the anode, cathode, and gate regions. The parameters of the various portions of the semiconductor bodies of the structures of the above-discussed patent applications are such that with the potential of the anode region being greater than that of the cathode region and the potential of the gate region being insufficient to cause the potential of a vertical cross-sectional portion of the bulk of the semiconductor body between the anode and cathode to be greater in potential than the anode or cathode regions, there is facilitated a substantial current flow between the anode and cathode regions via the bulk. With the potential of the gate region being sufficiently more positive than that of the anode and cathode regions to cause a vertical cross-sectional portion of the bulk of the semiconductor body between the anode and cathode regions to be more positive in potential than the anode and cathode regions, there is facilitated an interrupting or inhibiting of current flow between the anode and cathode regions. The magnitude of the needed gate potential necessary to turn off these switches is a function of the geometry and impurity concentration (doping) levels of the semiconductor regions of each switch and of the anode and cathode potentials.

Control circuitry used to apply a blocking voltage to the gate terminal of each of these switches must be able to sustain a more positive voltage than is at the anode and cathode terminals and must be able to supply current which is generally of the same magnitude as flows through the anode and cathode of each switch.

U.S. patent application Ser. No. 972,023 (A. R. Hartman-T. J. Riley-P. W. Shackle), filed Dec. 20, 1978, Ser. No. 107,771 (A. R. Hartman-T. J. Riley-P. W. Shackle), filed Dec. 28, 1979, and Ser. No. 150,184 (J. A. Davis-W. F. MacPherson-H. E. Mussman-P. W. Shackle), filed May 15, 1980, all having a common assignee with the present application, describe and illustrate control circuitry which itself uses a high voltage and current switch of the type described hereinabove to control the state of a similar switch. The present application represents an alternate to the control circuitry discussed hereinabove.

It is desirable to have circuitry capable of controlling high voltage and high current solid-state switches of the type disclosed in the patent applications discussed hereinabove. U.S. patent application Ser. Nos. 107,777 and 107,778 (J. A. Davis-W. F. MacPherson-H. E. Mussman-P. W. Shackle and J. A. Davis-W. F. MacPherson-P. W. Shackle), both filed Dec. 28, 1979, and having a common assignee and some common inventorship with the present application, disclose control circuitry which is an alternate to the circuitry of the present application. The present application has priority over the aforementioned applications.

SUMMARY OF THE INVENTION

A solution to the problem of controlling the state of a first high voltage and relatively high current solid-state switch (GDS1) of the type discussed hereinabove in accordance with the present invention, is circuitry comprising a second high voltage and relatively high current solid-state switch (GDS2) of the type discussed hereinabove with a second output terminal of GDS2 coupled to the control terminal of GDS1 and a control circuit branch characterized by third and fourth switch branches, and a level shifting branch with the control terminal and a first output terminal of the third switch branch being coupled to an input terminal and to the control terminal of the fourth switch branch, respectively. An output terminal of the fourth switch branch is coupled to the first output terminal of GDS2, and the first and second terminals of the level shifting branch being coupled to the control terminal of GDS2 and to the second output terminal of the fourth switch branch, respectively.

The state of GDS2 is controlled essentially by the third and fourth switch branches. An input signal applied to the control terminal of the third switch branch controls the state thereof. The state of GDS2 controls the state of GDS1. The fourth switch branch serves to limit current which flows into the gate of GDS1 from GDS2. This acts to prevent conduction overload through GDS1 and GDS2 which could destroy them.

These and other features of the invention are better understood from a consideration of the following de-

DETAILED DESCRIPTION

Figure 1:
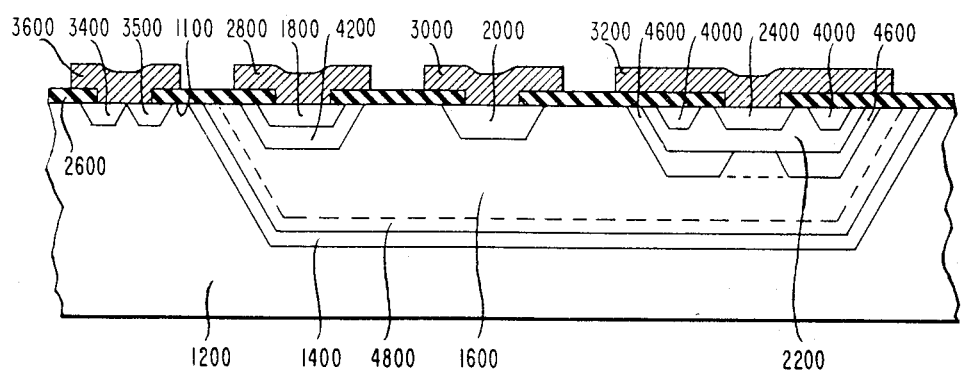
FIG. 1 illustrates a sectional view of a high voltage semiconductor switch.

Referring now to FIG. 1, there is illustrated a preferred embodiment of a high voltage switch structure 1000 comprising a support member 1200 having a major surface 1100 and a monocrystalline semiconductor body 1600 whose bulk is of relatively high resistivity and which is separated from support member 1200 by a dielectric layer 1400.

A localized anode region 1800, which is of p+ type conductivity, is included in body 1600 and has a portion thereof that extends to surface 1100. A p type region 4200 surrounds anode region 1800. A localized gate region 2000, which is of n+ type conductivity, and a localized cathode region 2400, which is of n+ type conductivity, are also included in body 1600. A region 2200, which is of the p type conductivity and has a portion which extends to surface 1100, encircles cathode 2400 and acts as a depletion layer punch-through shield. A guard ring like region 4000, which is of p+ type conductivity, encircles region 2400 and is separated therefrom by portions of region 2200. A region 4600, which is of p− type conductivity, partially surrounds region 2200. As is indicated by the dashed line between portions of region 4600, region 4600 can completely surround a bottom portion of region 2200. It also acts to inhibit inversion of the portions of body 1600 at or near surface 1100 between regions 2000 and 2400. Gate region 2000 is located between anode region 1800 and region 2200 and is separated from both by bulk portions of body 1600. The resistivities of regions 1800, 2000, and 2400 are low compared to that of the bulk portion of body 1600. The resistivity of region 2200 is intermediate that of cathode region 2400 and that of the bulk portion of body 1600. The resistivity of region 4600 is intermediate between that of region 2200 and the bulk portion of semiconductor body 1600. Layer 4800, which is illustrated by a dashed line, is of n type conductivity and may be directly or indirectly electrically coupled to gate region 2000. Layer 4800 is optional.

Electrodes 2800, 3000, and 3200 are conductors which make low resistance contact to the surface portions 1100 of regions 1800, 2000, and 2400, respectively. A dielectric layer 2600 covers major surface 1100 so as to isolate electrodes 2800, 3000, and 3200 from all regions other than those intended to be electrically contacted. An electrode 3600 provides a low resistance contact to support 1200 by way of highly doped regions 3400 or 3500. Regions 3400 and 3500 are of opposite conductivity types. This allows for low resistance contact to support 1200 independent of whether same is of n or p type conductivity.

Advantageously, the support 1200 and the body 1600 are each of silicon with the support 1200 being either of n or p type conductivity. Each of electrodes 2800, 3000, and 3200 advantageously overlaps the semiconductor region to which it makes low resistance contact. Electrode 3200 also overlaps region 2200. This overlapping, which is known as field plating, facilitates high voltage operation because it increases the voltage at which breakdown occurs.

A plurality of separate bodies 1600 can be formed in a common support 1200 to provide a plurality of switches.

Structure 1000 is typically operated as a switch which is characterized by a low impedance path between anode region 1800 and cathode region 2400 when in the ON (conducting) state and as a high impedance between said two regions when in the OFF (blocking) state. With proper operating potentials applied to anode region 1800 and cathode region 2400, the potential applied to gate region 2000 determines the state of the switch. Conduction between anode region 1800 and cathode region 2400 occurs if the potential of gate region 2000 is below that of the potential of anode region 1800, cathode region 2400, and shield region 2200. During the ON state holes are injected into body 1600 from anode region 1800 and electrons are injected into body 1600 from cathode region 2400. The ON state can be achieved by applying proper operating potentials to the anode and cathode regions and forward-biasing the anode region with respect to the gate region. These holes and electrons exist in sufficient numbers to form a plasma which conductivity modulates body 1600. This effectively lowers the resistance of body 1600 such that the resistance between anode region 1800 and cathode region 2400 is relatively low when structure 1000 is operating in the ON state. This type of operation is denoted as dual carrier injection.

Region 2200 helps limit the punch-through of a depletion layer formed during operation between gate region 2000 and cathode region 2400 and helps inhibit formation of a surface inversion layer between these two regions. In addition, it facilitates gate region 2000 and cathode region 2400 being relatively closely spaced apart. This facilitates relatively low resistance between anode region 18 and cathode region 24 during the ON state.

Support 1200 is typically held at the most positive potential level available. During the OFF state conduction between anode region 1800 and cathode region 2400 is inhibited or cut off if the potential of gate region 2000 is sufficiently more positive than that of anode region 1800, cathode region 2400, and region 2200. The amount of excess positive potential needed to inhibit or cut off conduction is a function of the geometry and impurity concentration (doping) levels of structure 1000. This positive gate potential causes the portion of body 1600 between gate region 2000 and the dielectric layer 1400 to be more positive in potential than anode region 1800, cathode region 2400, and/or region 2200. This positive potential barrier inhibits the conduction of holes from region 1800 to cathode region 2400.

With the semiconductor body 1600 and anode region 1800 both being of p type conductivity, structure 1000 is one of the basic structures disclosed and described in a copending U.S. patent application Ser. No. 107,774 (A. R. Hartman et al), filed Dec. 28, 1979, in which there is a common assignee. In this structure, which is denoted as a gated diode switch (GDS) in the aforesaid copending application, the positive gate voltage causes a cross-sectional portion of semiconductor body between the gate region and the dielectric layer therebelow to be essentially depleted as well as the potential thereof being greater than that of the anode, cathode, and shield region. The positive potential of this cross-sectional portion of semiconductor body inhibits the conduction of holes from the anode region to the cathode region and serves to collect electrons emitted at the cathode region before they can reach the anode region.

With the semiconductor body 1600 being of n type conductivity and regions 4800, 4200, 4000, and 4600 excluded, and region 1800 being of p type conductivity, structure 1000 is the structure disclosed and described in a copending U.S. patent application Ser. No. 107,775 (A. R. Hartman-T. J. Riley-P. W. Shackle), filed Dec. 28, 1979, which has a common assignee with this application. In this structure the positive gate potential causes depletion regions to form at the junction of the anode region and semiconductor body and at the junction of the shield region and semiconductor body. In addition this causes a vertical cross-sectional portion of the semiconductor body between the anode and cathode regions to be more positive in potential than the anode, cathode, and/or shield regions. The positive potential of this cross-sectional portion of semiconductor body inhibits conduction of holes from the anode region to the cathode region and serves to collect electrons emitted at cathode region before they can reach anode region.

The gated diode switches disclosed in U.S. application Ser. Nos. 972,022 and 971,886, filed Dec. 20, 1978, operate in a very similar fashion to the one described in application Ser. No. 972,056.

The structure disclosed in the aforementioned article entitled "A Field Terminated Diode", is a vertical geometry solid-state high voltage switch which operates in a similar fashion to the gated diode switches.

All of the above-disclosed structures are high voltage switches that have separate anode, cathode, and gate regions, are characterized by dual carrier conduction, and are controlled in similar manners.

Figure 2:
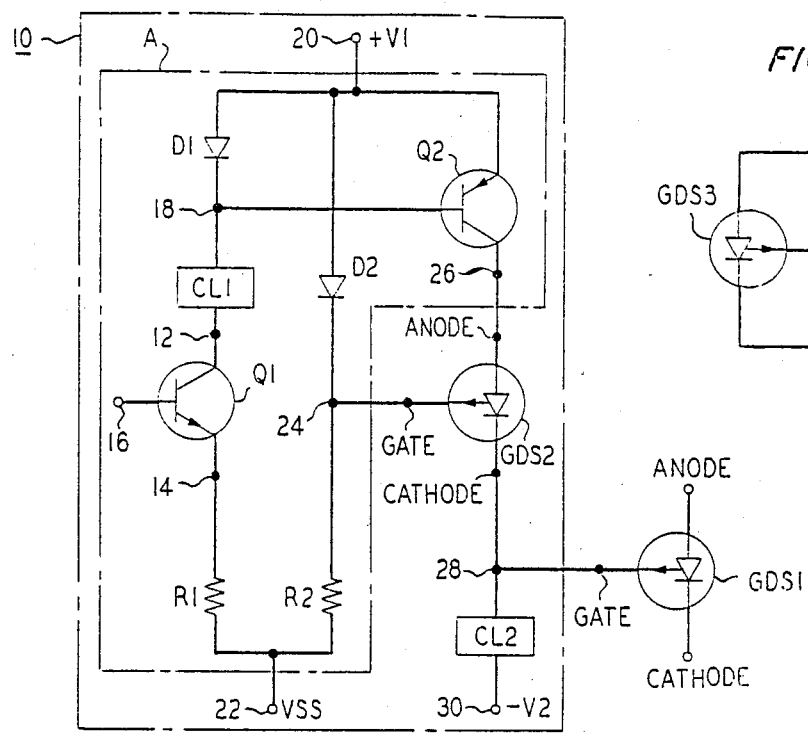
FIG. 2 illustrates a switch with an embodiment of control circuitry in accordance with the invention.

Referring now to FIG. 2, there is illustrated control circuitry 10 (within the larger dashed line rectangle) which is coupled to the gate terminal (28) of a gated diode switch GDS1 that has anode and cathode terminals. Control circuitry 10 serves to control the state of GDS1 and comprises transistors Q1 and Q2, diodes D1 and D2, a gated diode switch GDS2, current limiters CL1 and CL2, and resistors R1 and R2. Components Q1, CL1, D1, Q2, D2, R1, and R2 serve as a control circuit branch (illustrated within dashed line rectangle A) which serves to control the anode-to-cathode potential of GDS2. R2 is optional and can be eliminated. Q1 may be denoted as a third switch branch. The base, collector, and emitter terminals of Q1 may be denoted as the control and first and second output terminals, respectively. Q2 may be denoted as a fourth switch branch. The base, collector, and emitter terminals of Q2 may be denoted as the control and first and second output terminals, respectively. D2 may be denoted as a level shifting branch.

In one illustrative embodiment, Q1 is an n-p-n junction transistor, Q2 is a p-n-p junction transistor, and D1 and D2 are p-n junction diodes. GDS2 has the basic structure described in copending U.S. patent application Ser. No. 971,886 (A. R. Hartman et al). CL1 and CL2 are pinch resistors. The collector of Q1 is coupled to one terminal of CL1 and to a terminal 12. The base of Q1 is coupled to an input terminal 16 and the emitter of Q1 is coupled to one terminal of R1 and to a terminal 14. A second terminal of R1 is coupled to a terminal 22 and to a power supply VSS. A second terminal of CL1 is coupled to the base of Q2, the cathode of D1, and to a terminal 18. The emitter of Q2 is coupled to the anode of D1, a power supply +V1, and to a terminal 20. The collector of Q2 is coupled to the anode of GDS2 and to a terminal 26. The anode of D2 is coupled to terminal 20 and the cathode of D2 is coupled to the gate of GDS2, a first terminal of R2, and to a terminal 24. A second terminal of R2 is coupled to terminal 22. The cathode of GDS2 is coupled to a first terminal of CL2, the gate of GDS1, and to terminal 28. A second terminal of CL2 is coupled to a power supply −V2 and to a terminal 30.

The basic operation of GDS1 is as follows. Assuming the anode and cathode of GDS1 are coupled to +220 volts and −220 volts, respectively, conduction occurs between anode and cathode thereof if the gate of GDS1 (terminal 28) is less positive than +220 volts. Conduction is cut off (interrupted) by increasing the potential of the gate (terminal 28) above +220 volts and by providing a source of current to flow into the gate (terminal 28) of GDS1. With +V1=+250 volts, VSS=zero volts, −V2=−250 volts, and current limiters CL1 and CL2 limiting current therethrough to 50 and 5 microamperes each, circuitry 10 is capable of providing the needed potentials at terminal 28 and the current supply capability necessary to control the state of GDS1.

If it is desired to allow conduction through GDS1, a 0 to 0.4 volt input signal is applied to input terminal 16. This biases Q1 off and terminal 18 assumes the potential of approximately +V1. This condition biases Q2 off and results in an essentially open circuit between +V1 and terminal 26 (the anode of GDS2). Thus, GDS2 is in an OFF state since no current can flow between the anode and cathode thereof. With GDS2 in the OFF state terminal 28 is isolated from +V1 and tends to assume the negative potential of −V2 (−250 volts) until the gate-to-anode junction potential of GDS1 becomes forward-biased. Terminal 28 now rises to a potential which is below, but close to the potential of the anode of GDS1. Accordingly, GDS1 is biased to the ON state and conduction occurs between the anode and cathode thereof. The current from the anode to the gate of GDS1 is limited by CL2.

The potential of terminal 16 is now pulsed to 3–5 volts. As will become clear, this causes GDS1 to switch to the OFF (blocking) state. Q1 is biased on and operates in saturation. This causes D1 and the emitter-base junction of Q2 to be forward-biased. Thus, Q2 is biased on and conduction from +V1 through the emitter-collector of Q2, the anode-cathode of GDS2 and CL2 to −V2 is possible. The collector-emitter voltage (VCE) of Q2 with Q2 biased on and conducting is selected to be of a lower magnitude than the forward voltage drop across D2. This insures that the potential of the anode (terminal 26) is more positive than that of the gate (terminal 24) such that GDS2 stays in the ON state. With GDS2 in the ON state terminal 28 assumes a potential level close to +V1. This potential level is sufficiently more positive than the potential level at the anode of GDS1 to switch GDS1 to the OFF state. The geometry and impurity concentrations (doping levels) of GDS1 determine exactly how much more positive the potential at the gate must be relative to the anode to turn off GDS1.

In order to switch GDS1 to the OFF state it is necessary to not only apply the needed potential level to the gate of GDS1, but in addition, to cause a flow of current into the gate of GDS1 that is of a magnitude comparable to that of the magnitude of the current flow between the anode and cathode of GDS1. Most of the current that flows into the gate of GDS1 flows from +V1, through D2, and then through the gate and cathode of GDS2. The balance flows from +V1, through the collector-emitter of Q2, and then through the anode-cathode of GDS2. This current flow can be substantial and as a result it is necessary to have a high voltage and current device such as GDS2 to switch GDS1 to the OFF state. The high cost of a high voltage and high current transistor limits its application in this control circuit.

The current gain of Q2 serves to limit the current flow into the gate of GDS1 from GDS2. This helps insure against burn out of GDS1 and/or GDS2. In many telephone switching applications GDS1 operates with only 48 volts between anode and cathode when in the OFF state; however, it is possible that ±220 volts exists at the anode and/or cathode due to ringing and induced 60 Hz voltages and, accordingly, circuit 10 is designed to block these high voltages.

Figure 3:
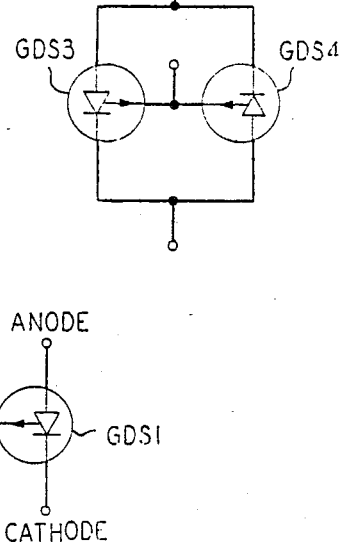
FIG. 3 illustrates a bidirectional switch which also can be controlled by the control circuitries illustrated in FIGS. 2 and 4.

Referring now to FIG. 3, there is illustrated a bidirectional switch which comprises gated diode switches GDS3 and GDS4, with the anode of GDS3 coupled to the cathode of GDS4, the cathode of GDS3 coupled to the anode of GDS4, and the gates of both being coupled together. This type of bidirectional switch is disclosed in copending U.S. patent application Ser. No. 971,886 (A. R. Hartman et al). The gates of GDS3 and GDS4 can be coupled to terminal 28 of the control circuit 10 of FIG. 1 instead of GDS1 being coupled thereto. The state of GDS3 and of GDS4 can thus be controlled in essentially the same manner as is described for the control of GDS1.

Figure 4:
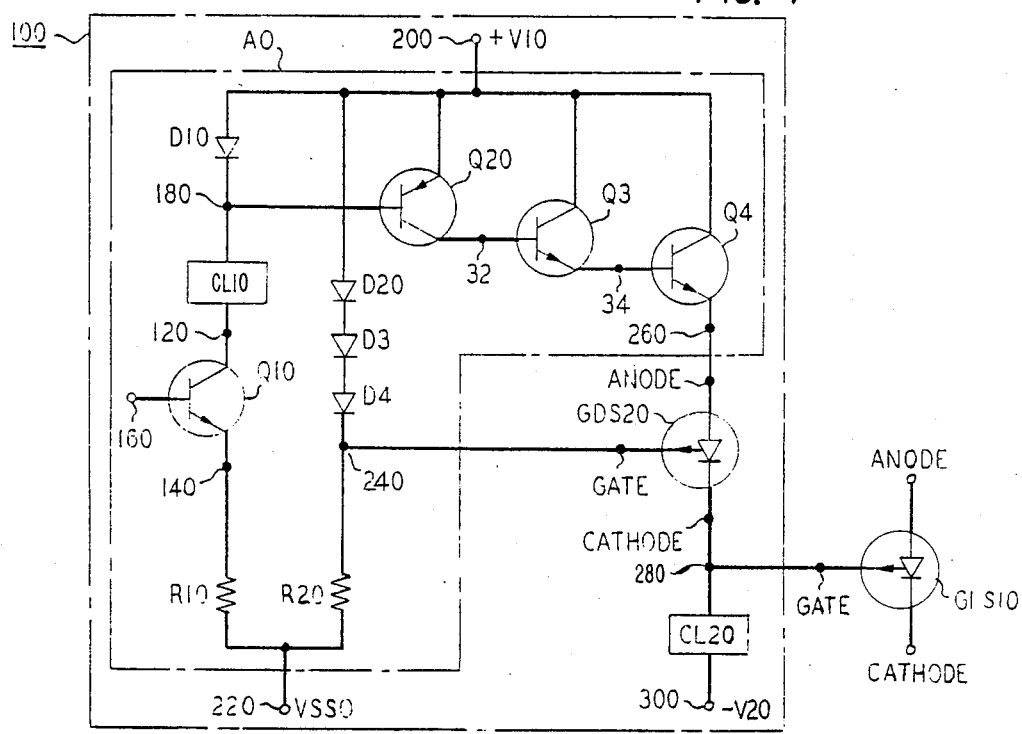
FIG. 4 illustrates a switch with another embodiment of control circuitry in accordance with the present invention.

Referring now to FIG. 4, there is illustrated control circuitry 100 (within the larger dashed line rectangle) which is coupled to the gate terminal of a gated diode switch GDS10. Control circuitry 100 is similar to control circuitry 10 of FIG. 2 except that n-p-n transistors Q3 and Q4 and p-n diodes D3 and D4 have been added as is illustrated. Components and terminals of circuit 100 of FIG. 3 which are essentially identical or similar to those of circuit 10 of FIG. 1 have the same reference denotation with an additional "0" at the end. Q10 may be denoted as a third switch branch. The base, collector, and emitter terminals of Q10 may be denoted as the control and first and second output terminals, respectively. The combination of Q20, Q3, and Q4 may be denoted as a fourth switch branch. The base of Q20 may be denoted as the control terminal of the fourth switch branch. The emitter and collector of Q4 may be denoted as the first and second output terminals of the fourth switch branch. D20, D3, and D4 may be denoted as a level shifting branch.

Q3 and Q4 are coupled together in a Darlington type configuration with the collectors being common and being coupled to a terminal 200 and the emitter of Q3 is coupled to the base of Q4 and to a terminal 34. The collector of Q20 is coupled to the base of Q3 and to terminal 32. The emitter of Q20 is also coupled to terminal 200. The emitter of Q4 is coupled to the anode of GDS20 and to a terminal 260. D20, D3, and D4 are serially coupled together between terminals 200 and 240 with the anode of D20 coupled to terminal 200 and the cathode of D4 coupled to terminal 240. Components Q10, CL10, D10, Q20, Q3, Q4, D20, D3, D4, R10, and R20 serve as a control circuit branch (illustrated within dashed line rectangle A0) which serves to control the potential of the anode of GDS20 relative to the cathode thereof. R20 is optional and can be eliminated.

It is difficult in some semiconductor technologies to achieve a p-n-p transistor which has high current gain. The combination of Q20 and Q3 and Q4 essentially acts as the equivalent of a p-n-p transistor which has a relatively high current gain. Thus Q20, Q3, and Q4 perform essentially the same function as Q2 of FIG. 2. D3 and D4 are needed to offset the additional emitter-base voltage drops of Q3 and Q4. With Q20, Q3, and Q4 biased on, the voltage at the gate of GDS20 (terminal 240) is less positive than at the anode of GDS20 (terminal 260). This helps insure that GDS20 is in the ON state.

The circuitry of FIG. 4, excluding R20 has been built and tested with GDS10 and GDS20 being of the type disclosed in previously cited copending U.S. patent application Ser. No. 971,886 (A. R. Hartman et al). The built control circuitry 100 allowed the blocking of 500 volts across the anode and cathode of GDS10 and cut off (interrupted) 100 milliamperes of current flow therethrough.

Figure 5:
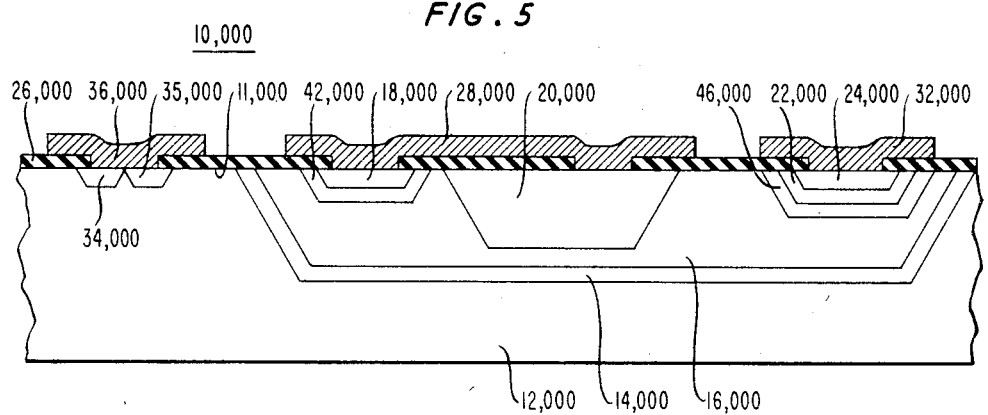
FIG. 5 illustrates an embodiment of a structure which can be used as part of the control circuitries illustrated in FIGS. 2 and 4.

Referring now to FIG. 5, there is illustrated a structure 10,000 comprising a semiconductor support member 12,000 having a major surface 11,000 and a monocrystalline semiconductor body 16,000 whose bulk is of p type conductivity and is separated from support member 12,000 by a dielectric layer 14,000. Contact p+ type and n+ type regions 34,000 and 35,000 exist within a portion of support member 12,000 and have a common electrode 36,000 coupled thereto. Electrode 36,000 is electrically isolated from all portions of surface 11,000, except where it contacts region 34,000, by a dielectric layer 26,000.

Support member 12,000 is of n or p type conductivity and usually includes therein at least one other dielectrically isolated semiconductor body (not illustrated) like semiconductor body 1600 of FIG. 1. Localized first and second separated p+ type conductivity regions 18,000 and 24,000 are included in body 16,000 with each having a portion that forms a part of surface 11,000. A region 42,000 which is of p type conductivity, surrounds region 18,000. A region 22,000, which is also of p type conductivity surrounds region 24,000, and is in turn surrounded by a region 46,000, which is of p− type conductivity. A localized n+ type conductivity region 20,000 is included in body 16,000 and is located in between regions 18,000 and 24,000. An electrode 28,000 is coupled to regions 18,000 and 20,000. A separate electrode 32,000 is coupled to region 24,000. Electrodes 28,000 and 32,000 are separated from surface 11,000 by dielectric layer 26,000 except where they contact the respective regions.

Structure 10,000 acts essentially as a pinch resistor with region 20,000 pinching off semiconductor body 16,000 to create a relatively high resistance region between the bottom of region 20,000 and the top of dielectric layer 14,000. Structure 10,000 acts to limit current flow between regions 18,000 and 24,000. Within a first range of potential difference between regions 18,000 and 24,000 the resistances between the two regions is essentially constant and current therethrough increases linearly with voltage. Once this range is exceeded, the potential of region 18,000 rises with respect to 24,000 and the electrical field created under electrode 28,000 tends to effectively further pinch off the portion of semiconductor body 16,000 under region 20,000. This increases the resistance between regions 18,000 and 24,000 and thus limits current flow from one region to the other as the voltage cross the regions increases. Structure 10,000 thus acts as a current limiter.

The embodiments described herein are intended to be illustrative of the general principles of the present invention. Various modifications are possibly consistent with the spirit of the invention. For example, other switching devices, such as MOS transistors, could be substituted for the bipolar transistors provided appropriate voltage magnitudes and polarities are adjusted as is well known in the art. Still further, high voltage switches like structure 1000 of FIG. 1 and the type discussed in the Background of the Invention herein can be substituted for the specific gated diode switch used.

I claim:

1. Circuitry coupled to the gate of a first gated diode switch (GDS1, GDS3, GDS4, GDS10) which has a gate, an anode, and a cathode, comprising a second gated diode switch (GDS2, GDS20) which has a gate, an anode, and a cathode, the cathode of the second gated diode switch (GDS2, GDS20) being coupled to the gate of the first gated diode switch (GDS1, GDS3, GDS4, GDS10), a control circuit branch (A, A0) is coupled to the second gated diode switch (GDS2, GDS20) for controlling conduction between the anode and cathode thereof, and being characterized in that:
the control circuit branch (A, A0) comprises:
a third switch branch (Q1, Q10) having a control terminal which is coupled to an input terminal (16, 160), and having first (12, 120) and second (14, 140) output terminals;

a fourth switch branch (Q2 and Q20, Q3, Q4) having a control terminal (18, 180) coupled to the first output terminal (12, 120) of the third switch branch and having first (26, 260) and second (20, 200) output terminals with the first output terminal (26, 260) being coupled to the anode of the second gated diode switch (GDS2, GDS20); and a level shifting branch (D2, and D20, D3, D4) having a first terminal coupled to the second output terminal (20, 200) of the fourth switch circuit means (Q2 and Q20, Q3, Q4), and having a second terminal (24, 240) coupled to the gate of the second gated diode switch (GDS2, GDS20).

2. The circuitry of claim 1 characterized in that the third switch branch (Q1, Q10) is an n-p-n transistor, the fourth switch branch (Q2) is a p-n-p transistor, and the level shifting branch (D1) is a p-n diode.

3. The circuitry of claim 2 characterized in that:
the third switch branch (Q10) is a first n-p-n transistor (Q10) and the fourth switch branch (Q20, Q3, Q4) is the combination of a p-n-p transistor (Q20), a second n-p-n transistor (Q3), and a third n-p-n transistor (Q4);

the collector of the first n-p-n transistor (Q10) is coupled to the base of the p-n-p transistor (Q20);

the collector of the p-n-p transistor (Q20) is coupled to the base of the second n-p-n transistor (Q3);

the emitter of the second n-p-n transistor (Q3) is coupled to the base of the third n-p-n transistor (Q4);

the emitter of the third n-p-n transistor (Q4) is coupled to the anode of the second gated diode switch (GDS20); and the level shifting branch (D20, D3, D4) comprises first (D20), second (D3), and third (D4) p-n diodes which are serially connected together with the cathode of the first coupled to the anode of the second and the cathode of the second coupled to the anode of the third.

* * * * *